(12) United States Patent
Shen et al.

(10) Patent No.: US 9,554,472 B2
(45) Date of Patent: Jan. 24, 2017

(54) PANEL WITH RELEASABLE CORE

(71) Applicant: Intel Corporation, Santa Clara, CA (US)

(72) Inventors: Ching-Ping Janet Shen, Gilbert, AZ (US); Ravi Shankar, Chandler, AZ (US); Yonggang Li, Chandler, AZ (US); Dilan Seneviratne, Phoenix, AZ (US); Charan K. Gurumurthy, Higley, AZ (US)

(73) Assignee: Intel Corporation, Santa Clara, CA (US)

( * ) Notice: Subject to any disclaimer, the term of this patent is extended or adjusted under 35 U.S.C. 154(b) by 359 days.

(21) Appl. No.: 14/227,723

(22) Filed: Mar. 27, 2014

(65) Prior Publication Data

US 2015/0181717 A1    Jun. 25, 2015

Related U.S. Application Data

(63) Continuation-in-part of application No. 14/135,168, filed on Dec. 19, 2013.

(51) Int. Cl.
*H05K 3/46* (2006.01)
*H05K 1/02* (2006.01)
(Continued)

(52) U.S. Cl.
CPC ............... *H05K 3/10* (2013.01); *B23K 1/0008* (2013.01); *B32B 7/12* (2013.01); *B32B 15/08* (2013.01); *B32B 15/20* (2013.01); *B32B 27/08* (2013.01); *B32B 27/283* (2013.01); *B32B 27/38* (2013.01); *H05K 1/0271* (2013.01); *H05K 1/181* (2013.01); *H05K 1/183* (2013.01); *H05K 3/022* (2013.01); *H05K 3/386* (2013.01);
(Continued)

(58) Field of Classification Search
CPC ...... H05K 3/338; H05K 3/4664; H05K 1/183; H05K 1/0271; H05K 3/30; H05K 3/4652; H05K 2201/0338
See application file for complete search history.

(56) References Cited

U.S. PATENT DOCUMENTS 5,063,658 A * 11/1991 Wild ...................... H05K 3/205
156/233
5,306,670 A * 4/1994 Mowatt ............... H01L 23/5383
257/E23.172

(Continued)

OTHER PUBLICATIONS

"U.S. Appl. No. 14/135,168, Examiner Interview Summary mailed Aug. 26, 2015", 2 pgs.

(Continued)

*Primary Examiner* — Jeremy C Norris
*Assistant Examiner* — Nathan Milakovich
(74) *Attorney, Agent, or Firm* — Schwegman Lundberg & Woessner, P.A.

(57) ABSTRACT

Generally discussed herein are systems and apparatuses that can include a releasable core panel. The disclosure also includes techniques of making and using the systems and apparatuses. According to an example a technique of making a releasable core panel can include coupling an inner foil to a substantially rectangular base, situating an outer conductive foil situated on the inner foil, or coupling, using a connective material, the inner foil and the outer conductive foil near edges of the outer conductive foil and the inner foil.

25 Claims, 12 Drawing Sheets

(51) Int. Cl.
| | | |
|---|---|---|
| H05K 3/10 | (2006.01) | |
| H05K 1/18 | (2006.01) | |
| B23K 1/00 | (2006.01) | |
| B32B 7/12 | (2006.01) | |
| B32B 15/08 | (2006.01) | |
| B32B 15/20 | (2006.01) | |
| B32B 27/08 | (2006.01) | |
| B32B 27/28 | (2006.01) | |
| B32B 27/38 | (2006.01) | |
| H05K 3/02 | (2006.01) | |
| H05K 3/38 | (2006.01) | |
| H05K 3/28 | (2006.01) | |

(52) U.S. Cl.
CPC ....... *B32B 2255/06* (2013.01); *B32B 2255/26* (2013.01); *B32B 2270/00* (2013.01); *B32B 2307/202* (2013.01); *B32B 2419/00* (2013.01); *B32B 2457/08* (2013.01); *H05K 3/284* (2013.01); *Y10T 29/49124* (2015.01); *Y10T 428/24851* (2015.01)

(56) References Cited

U.S. PATENT DOCUMENTS

| | | | | |
|---|---|---|---|---|
| 5,806,177 | A * | 9/1998 | Hosomi | H05K 3/4655 156/233 |
| 5,942,314 | A * | 8/1999 | Fisher | B23K 20/10 228/1.1 |
| 6,175,084 | B1 * | 1/2001 | Saitoh | H01L 23/142 174/250 |
| 6,523,734 | B1 * | 2/2003 | Kawai | G06K 19/07718 156/73.1 |
| 6,663,980 | B1 * | 12/2003 | Saijo | B23K 20/04 228/205 |
| 7,222,421 | B2 * | 5/2007 | Nakamura | H05K 3/0097 156/248 |
| 9,161,452 | B2 | 10/2015 | Huang | |
| 2005/0082669 | A1 * | 4/2005 | Saijo | H01L 24/81 257/737 |
| 2007/0095471 | A1 * | 5/2007 | Ito | H01L 23/5385 156/293 |
| 2007/0124924 | A1 * | 6/2007 | Nakamura | H05K 3/0097 29/830 |
| 2007/0277909 | A1 * | 12/2007 | Tsukahara | B23K 35/0244 148/24 |
| 2008/0053686 | A1 * | 3/2008 | Ishii | G11B 5/486 174/255 |
| 2008/0054448 | A1 * | 3/2008 | Lu | H01L 21/4882 257/707 |
| 2008/0202661 | A1 * | 8/2008 | Kobayashi | H01L 21/4857 156/50 |
| 2009/0025217 | A1 * | 1/2009 | Kamei | G11B 5/486 29/847 |
| 2010/0084748 | A1 * | 4/2010 | Poddar | H01L 21/4832 257/666 |
| 2011/0154657 | A1 * | 6/2011 | Chuang | H05K 3/0097 29/829 |
| 2011/0155443 | A1 * | 6/2011 | Maeda | H01L 21/4846 174/267 |
| 2013/0143062 | A1 * | 6/2013 | Kaneko | B32B 38/10 428/614 |
| 2014/0036465 | A1 * | 2/2014 | Hu | H05K 1/181 361/767 |
| 2014/0078706 | A1 * | 3/2014 | Hu | H01L 21/6835 361/771 |
| 2014/0090879 | A1 * | 4/2014 | Seneviratne | H01L 24/18 174/257 |
| 2014/0177193 | A1 * | 6/2014 | Jin | H01L 24/19 361/764 |
| 2014/0300009 | A1 * | 10/2014 | Hsu | H01L 23/49 257/784 |
| 2014/0305683 | A1 * | 10/2014 | Li | H05K 1/14 174/254 |
| 2014/0367155 | A1 * | 12/2014 | Huang | H05K 1/183 174/260 |
| 2015/0008566 | A1 * | 1/2015 | Gerber | H01L 24/97 257/668 |
| 2015/0111000 | A1 * | 4/2015 | Sasaki | B32B 7/04 428/157 |
| 2015/0174858 | A1 * | 6/2015 | Shankar | B32B 7/12 428/172 |
| 2015/0174859 | A1 | 6/2015 | Erie et al. | |
| 2015/0181713 | A1 | 6/2015 | Shen et al. | |
| 2016/0035661 | A1 * | 2/2016 | Suzuki | H01L 23/49822 174/251 |

OTHER PUBLICATIONS

"U.S. Appl. No. 14/135,168, Response filed Aug. 11, 2015 to Restriction Requirement mailed Jul. 28, 2015", 8 pgs.
"U.S. Appl. No. 14/135,168, Response filed Oct. 20, 2015 to Restriction Requirement mailed Aug. 31, 2015", 9 pgs.
"U.S. Appl. No. 14/135,168, Restriction Requirement mailed Jul. 28, 2015", 7 pgs.
"U.S. Appl. No. 14/135,168, Restriction Requirement mailed Aug. 31, 2015", 6 pgs.
"U.S. Appl. No. 14/227,750, Non Final Office Action mailed Oct. 22, 2015", 6 pgs.
"U.S. Appl. No. 14/227,750, Response filed Aug. 11, 2015 to Restriction Requirement mailed Jul. 29, 2015", 8 pgs.
"U.S. Appl. No. 14/227,750, Restriction Requirement mailed Jul. 29, 2015", 5 pgs.
Chiu, H. T, et al., "Study on mechanical properties and intermolecular interaction of silicone rubber/polyurethane/epoxy blends", Journal of Applied Polymer Science, 89(4), (Jul. 25, 2003), 959-970.
Hou, S. S, et al., "Function and performance of silicone copolymer. Part IV. Curing behavior and characterization of epoxy—siloxane copolymers blended with diglycidyl ether of bisphenol-A", Polymer, 41(9), (Apr. 2000), 3263-3272.
"U.S. Appl. No. 14/135,168, Examiner Interview Summary mailed Mar. 2, 2016", 3 pgs.
"U.S. Appl. No. 14/135,168, Examiner Interview Summary mailed Jul. 1, 2016", 3 pgs.
"U.S. Appl. No. 14/135,168, Final Office Action mailed Apr. 25, 2016", 7 pgs.
"U.S. Appl. No. 14/135,168, Non Final Office Action mailed Feb. 2, 2016", 6 pgs.
"U.S. Appl. No. 14/135,168, Response filed Mar. 25, 2016 to Non Final Office Action mailed Feb. 2, 2016", 5 pgs.
"U.S. Appl. No. 14/135,168, Response filed Jun. 27, 2016 to Final Office Action mailed Apr. 25, 2016", 6 pgs.
"U.S. Appl. No. 14/227,697, Non Final Office Action mailed May 9, 2016", 20 pgs.
"U.S. Appl. No. 14/227,750, Advisory Action mailed Apr. 6, 2016", 3 pgs.
"U.S. Appl. No. 14/227,750, Examiner Interview Summary mailed Mar. 2, 2016", 3 pgs.
"U.S. Appl. No. 14/227,750, Final Office Action mailed Feb. 3, 2016", 6 pgs.
"U.S. Appl. No. 14/227,750, Notice of Allowance mailed May 11, 2016", 7 pgs.
"U.S. Appl. No. 14/227,750, Response filed Mar. 25, 2016 to Final Office Action mailed Feb. 3, 2016", 5 pgs.
"U.S. Appl. No. 14/227,750, Response filed Apr. 19, 2016 to Advisory Action mailed Apr. 6, 2016", 5 pgs.
"U.S. Appl. No. 14/227,750, Response filed Dec. 29, 2015 to Non Final Office Action mailed Oct. 22, 2015", 10 pgs.

* cited by examiner

PANEL WITH RELEASABLE CORE

RELATED APPLICATION

This application is a continuation-in-part to U.S. patent application Ser. No. 14/135,168 with filing date Dec. 19, 2013, which is incorporated herein by reference in its entirety.

TECHNICAL FIELD

Examples generally relate to panel architectures and methods, such as panel architectures can facilitate the formation of a substrate thereon.

TECHNICAL BACKGROUND

Substrate manufacturing technology can include the use of panels to help increase the number of dies that can be manufactured at a given time. Substrate manufacturing can be inefficient, wasteful, or cost prohibitive. Such problems can be prevalent when building substrates using one or more panels.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DESCRIPTION OF EMBODIMENTS

Examples in this disclosure relate generally to substrates or panels, such as panels that can include coreless or cored substrates built thereon, and techniques of making and using the same. Examples also relate to systems that can include one or more of the substrates or panels.

Previous techniques for creating a releasable core panel include releasably coupling a conductive foil to a base through either vacuum pressing the conductive foil to the base or pressing the conductive into an adhesive layer on the base.

A premature delamination of a conductive foil can cause yield loss in manufacturing a substrate on the conductive foil. Another problem realized in manufacturing can include a warping a conductive foil or damaging an adhesive layer that couples the conductive foil to a base of the panel. When the conductive foil warps, the adhesion strength between the conductive foil and the base can be reduced (e.g., the peel strength required to remove the conductive can be reduced), thus making it easier for the conductive foil to be delaminated. Likewise, when the adhesive layer is damaged, the adhesion strength between the conductive foil and the base can be reduced.

A technique to reduce the risk of the conductive foil being delaminated or warped can include moving the contact area of the conductive foil inward from the edge of the panel so as to help protect the conductive foil from substrate manufacturing equipment. Such a panel is shown in FIG. 1.

Figure 1:
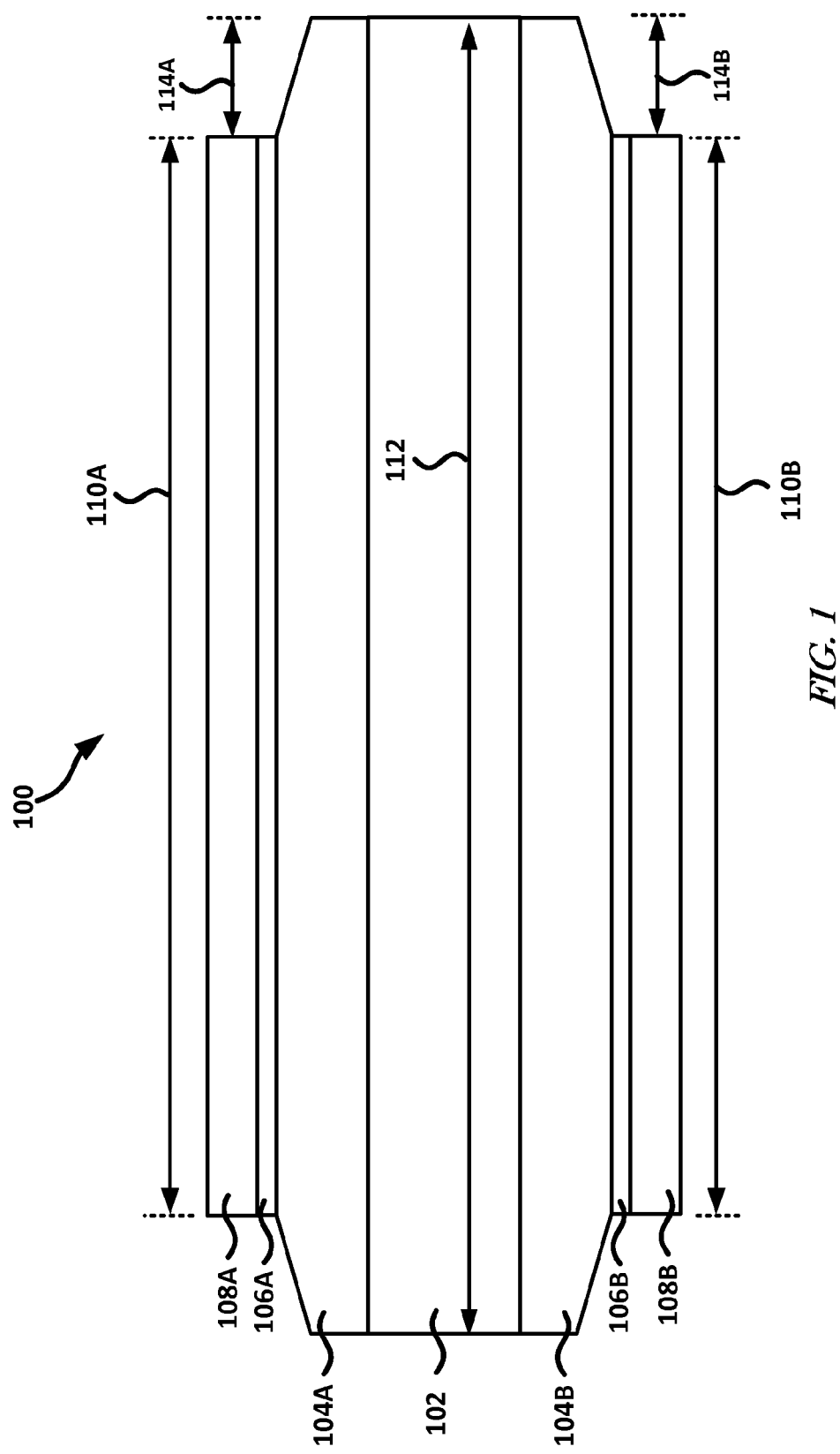
FIG. 1 shows a block diagram of an example of a core panel architecture.

FIG. 1 shows a block diagram of a panel 100. The panel 100 can include a base 102, an inner foil 104A or 104B, an adhesive layer 106A or 106B, or an outer conductive foil 108A or 108B. The outer conductive foil 108A-B can include a width 110A or 110B that is smaller than a width 112 of the base 102 or the inner foil 104A-B. The smaller width can provide an edge width 114A or 114B at which manufacturing equipment can grasp or otherwise contact the inner foil 104A-B, such as to reduce contact with the outer conductive foil 108A-B or the adhesive layer 106A-B during substrate manufacturing. However, including such an edge width 114A-B can reduce an area on which a substrate can be manufactured (e.g., the active area). The edge width 114A-B can reduce such an area by ten or more millimeters. A peel strength of the adhesive layer 106A-B can be damaged by heat, bumping, or a chemical that comes into contact with the adhesive layer 106A-B.

Figure 2:
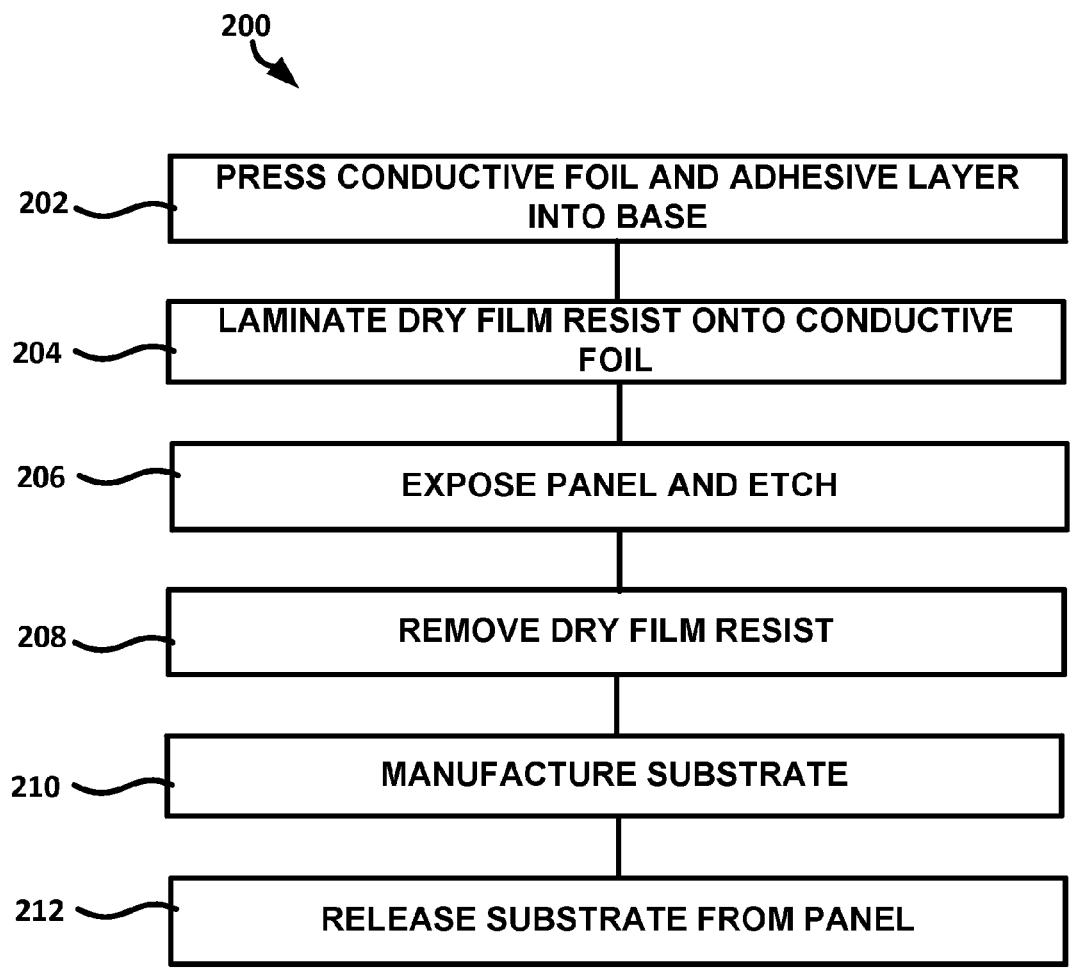
FIG. 2 shows a flow diagram of an example of a technique used to create the core panel architecture of FIG. 1.

FIG. 2 shows a flow diagram of a technique 200 of making the panel of FIG. 1. At 202, the inner foil 104A-B, outer conductive foil 108A-B, and adhesive layer 106A-B can be pressed into the base 102. At 204, a masking film (e.g., Dry Film Resist (DFR)) can be laminated to the outer conductive foil 108A-B. At 206, the panel 100 can be exposed and etched to remove the outer conductive foil at or near the edges of the panel. At 208, the masking film can be removed from the panel. At 210, a substrate can be manufactured on the outer conductive foil 108A-B. At 212, edges of the panel 100 can be removed. At 214, the manufactured substrate can be released from the panel 100. One or more process steps can be eliminated, such as by using a different panel architecture as discussed below. Eliminating a processing step can help reduce a cost associated with manufacturing a panel on which a substrate can be built.

Figure 3:
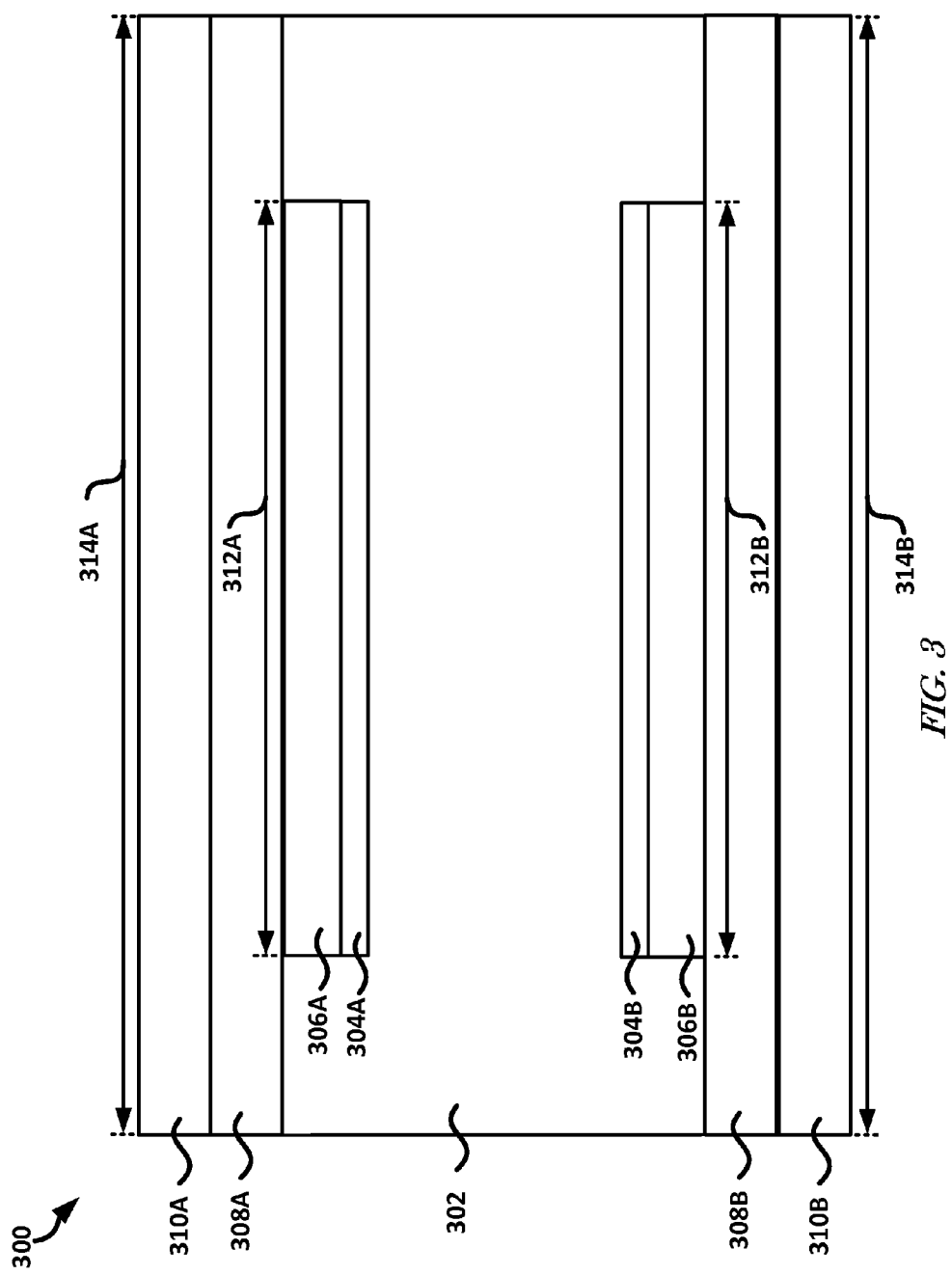
FIG. 3 shows a flow diagram of an example of another core panel architecture.

FIG. 3 shows an example of a core panel 300. The panel 300 can include a base 302, an inner foil 304A or 304B, an outer conductive foil 306A or 306B, or a resin 308A or 308B coating on an outermost conductive foil 310A or 310B. The inner foil 304A-B and the outer conductive foil 306A-B can include a width 312A or 312B that is less than a width 314A or 314B of the outermost conductive foil 310A-B and the base 302. The resin 308A-B and the outermost conductive foil 310A can jointly comprise a resin coated conductive layer. The resin coated conductive layer (i.e. 308A and 310A or 308B and 310B) can be pressed into the outer conductive foil 306A-B so as to form a temporary bond or seal between the resin 308A-B and the outer conductive foil 306A-B.

The base 302 can begin as a substantially rectangular structure and be processed to be generally "H" shaped, such as by forming a recess in each side of the base 302. The recesses in FIG. 3 are the areas in which the inner foil 304A-B and the outer conductive foil 306A-B are situated.

A substrate can be built on the outermost conductive foil 310A-B. The resin coated conductive layer can be removed from the base 302 and the outer conductive foil 306A, such as with the substrate thereon (substrate not shown in FIG. 3). The resin coated conductive layer can be removed from the substrate such as by etching, wet blasting, or a combination thereof.

The panel 300 can be cost prohibitive. Arranging the inner foil 304A-B and the outer conductive foil 306A-B within a recess in the base 302 (such as shown in FIG. 3) can increase the cost of the panel 300. The increase in cost can be due, at least in part, to extra processing that is required to arrange the inner foil 304A-B and the outer conductive foil 306A-B in a recess of the base 302. The increase in cost can be due, at least in part, to processing conductive foil panels to be the width 312A-B, and inserting the modified foil panels into the recess in the base 302.

Figure 4:
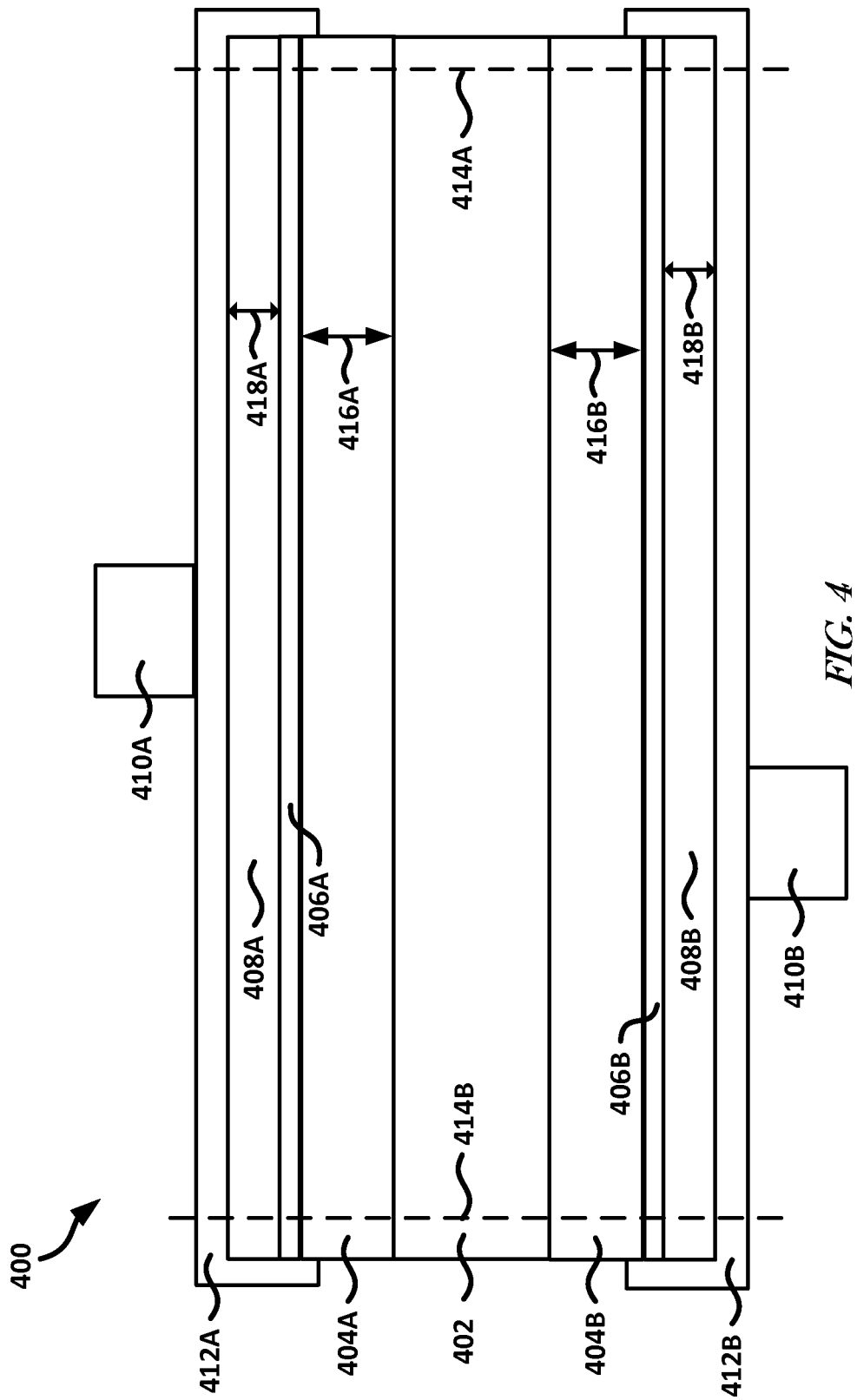
FIG. 4 shows a block diagram of an example of a panel according to one or more embodiments.

FIG. 4 shows an example of a panel 400 according to one or more embodiments. The panel 400 can be configured to protect an interface between an adhesive layer 406A or 406B and an inner foil 404A or 404B or an outer conductive foil 408A or 408B (e.g., the area of the panel 400 covered by a protective material 412A or 412B). The panel 400 can include a base 402, the inner foil 404A-B, the adhesive layer 406A-B, the outer conductive foil 408A-B, a die 410A or 410B, or the protective material 412A-B.

The base 402 can be substantially rectangular. The base 402 can include a material that is rigid enough to withstand processing at a substrate manufacturing factory and retain shape. In one or more embodiments, the base 402 can include a material impregnated with a polymer. In one or more embodiments, the base 402 can include a carbon material impregnated with an epoxy or resin. In one or more embodiments, the base 402 can include a metal, plastic, or other substantially rigid material. The base 402 can be generally rectangular and generally flat.

The inner foil 404A-B can be affixed to the base 402. A periphery of the inner foil 404A-B can be substantially flush with a periphery of the base 402, such as shown in FIG. 4. The inner foil 404A-B can include a conductive material such as copper, gold, silver, aluminum, a combination thereof, or other conductive material. In one or more embodiments the inner foil 404A-B can include a thickness 416A or 416B of between about ten and forty micrometers. In one or more embodiments, the inner foil 404A-B can include a thickness 416A-B of between about fifteen and about twenty micrometers. In one or more embodiments, the inner foil 404A-B can include a thickness 416A-B of about eighteen micrometers.

The adhesive layer 406A-B can releasably couple the outer conductive foil 408A-B to the inner foil 404A-B. The adhesive layer 406A-B can include an epoxy, resin, a combination thereof, or other material. The adhesive layer 406A-B can be pressed (e.g., hot pressed, baked with pressure, or laminated) into the inner foil 404A-B. Such pressing can form a releasable coupling between the inner foil 404A-B and the outer conductive foil 408A-B, such as shown in FIG. 4.

The base 402 and the outer conductive foil 408A-B can be releasably uncoupled, such as by mechanically removing (e.g., pulling) the outer conductive foil 408A-B away from the inner foil 404A-B. The outer conductive foil 408A-B can be removed from the inner foil 404A-B after a substrate (e.g., the die 410A-B and associated dielectric materials, vias, traces, interconnects, or other electric or electronic circuitry) has been manufactured on the panel 400. The outer conductive foil 408A-B can be removed from the panel 400 after edges of the panel 400 have been removed. The edges of the panel 400 can be removed by cutting the panel along the dotted lines 414A and 414B. Removing the edges can expose the interface between the adhesive layer 406A-B and the inner foil 404A-B and the outer conductive foil 408A-B, such as by removing the protective material 412A-B on the edge (e.g., along the side) of the panel 400. The outer conductive foil 408A-B can then be released from the panel 400.

The adhesive layer 406A-B can include a methyl ethyl ketone and toluene solvent with polydimethyl siloxane and bisphenol A based epoxy. An adhesive layer 406A-B made from these materials can suffer from phase separation between the epoxy and silicone over time. Heat can cause blisters to form in the adhesive layer 406A-B made from these materials. The adhesive strength of such adhesive layer 406A-B can degrade over time. An adhesive layer made of these materials can have poor line yields, such as in a substrate manufacturing factory.

As used herein releasably coupling means to couple such that a mechanical coupling through the adhesive layer 406A-B can be broken without requiring excessive force or damaging the items mechanically coupled through the adhesive layer 406A-B. The adhesive layer 406A-B can be released from an item by exerting a relatively small amount of force, such as about five Newtons per meter to about one hundred Newtons per meter on or near the adhesive layer 406A-B.

The adhesive layer 406A-B can include one or more epoxy silicone copolymers or blends of polymers, silicone, or epoxy. Different blends can be used to make adhesive layer 406A-B with varying mechanical properties, such as depending on the volume weight percent of polymer, silicone, or epoxy used. The mechanical properties can include hardness, elasticity, stickiness, or other mechanical property.

The adhesive layer 406A-B can include an epoxy and silicone blend. For example, siloxane and epoxy resin can be blended together with a carboxylic acid anhydride hardener, such as to produce a stable or well-blended adhesive layer 406A-B. This blend can be used as an adhesive by controlling the siloxane to epoxy resin ratio. By increasing the proportion of siloxane, an adhesive layer 406A-B with a reduced elastic modulus can be produced.

The adhesive layer 406A-B can include a blend of copolymer, epoxy, or silicone. A co-polymer of siloxane and epoxy can be produced and mixed with an epoxy resin. Polysiloxane can have an epoxide group on a side chain thereof and can be synthesized from methylhydrosiloxane, epoxy resin.

The outer conductive foil 408A-B can be coupled to the inner foil 404A-B using the adhesive layer 406A-B. A periphery of the outer conductive foil 408A-B can be substantially flush with a periphery of the base 402 or a periphery of the inner foil 404A-B, such as shown in FIG. 4. The outer conductive foil 408A-B can include a conductive material such as copper, gold, silver, aluminum, a combination thereof, or other conductive material. The outer conductive foil 408A-B can include a thickness 418A-B that is smaller than a thickness 416A-B of the inner foil 404A-B.

A yield loss realized in manufacturing a substrate onto the outer conductive foil 408A-B can be reduced by including an outer conductive foil 408A-B with a thickness 418A-B that is smaller than the thickness 416A-B of the inner foil 404A-B. In one or more embodiments, the thickness 418A-B of the outer conductive foil 408A-B can be between about one and thirty micrometers. In one or more embodiments, the thickness 418A-B of the outer conductive foil 408A-B can be between about two and fifteen micrometers. In one or more embodiments, the thickness 418A-B of the outer conductive foil 408A-B can be between about two and six micrometers. In one more embodiments, the thickness 418A-B of the outer conductive foil 408A-B can be between about three and five micrometers. In one or more embodiments, the thickness 418A-B of the outer conductive foil 408A-B can be about three, five, or eighteen micrometers.

As the thickness 418A-B of the outer conductive foil increases, the yield loss realized in manufacturing a substrate on the outer conductive foil 408A-B can be decreased. However, if the thickness 418A-B of the outer conductive foil is too large, delamination of the outer conductive foil 408A-B can increase yield loss. In an embodiment that includes an outer conductive foil 408A-B with a thickness 418A-B that is less than five micrometers, the outer conductive foil 408A-B may not be reliably releasable from the inner foil 404A-B. The outer conductive foil 408A-B can break in the separation process, or some residue from the outer conductive foil 408A-B or the adhesive layer 406A-B can be left on the inner foil 404A-B in the process of separating the outer conductive foil 408A-B from the inner foil 404A-B.

A periphery of the inner foil 404A-B can be substantially flush with a periphery of the base 402, such as shown in FIG. 4. A periphery of the outer conductive foil 408A-B can be substantially flush with a periphery of the base 402 or a periphery of the inner foil 404A-B, such as shown in FIG. 4.

The protective material 412A-B can be situated on the outer conductive foil 408A-B or on the side of the panel 400, such as to protect an interface between the adhesive layer 406A-B and the outer conductive foil 408A-B or the inner foil 404A-B. The protective material 412A-B can help protect the interface from chemicals, heat, bumping, or other external forces that can delaminate or damage the material behind the protective material 412A-B. The protective material 412A-D can include a metal, polymer, or other material that can adhere to the panel 400, such as at the inner foil 404A-B, the outer conductive foil 408A-B, the adhesive layer 406A-B, or the base 402.

The protective material 412A-B can include a metal, such as copper, gold, silver, or other metal, or a polymer or plastic. The protective material 412A-B can be electrolytically plated, applied in the form of a sheet, or otherwise flowed or dispensed on or mechanically coupled to the panel 400.

Adding the protective material 412A-B can reduce the yield loss or other concerns realized in using an outer conductive foil 408A-B with a thickness 418A-B that is less than five micrometers.

Figure 5:
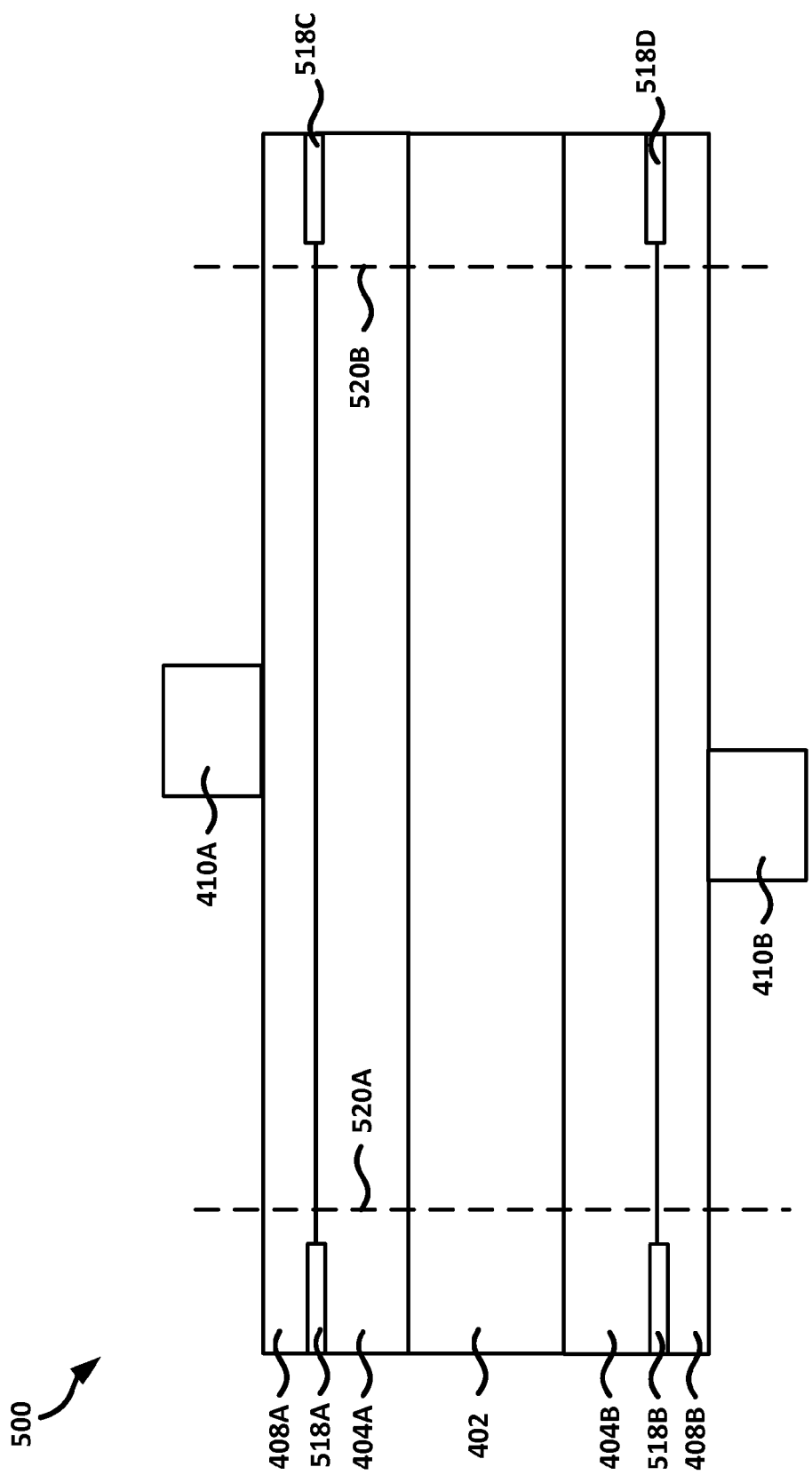
FIG. 5 shows a block diagram of another example of a panel according to one or more embodiments.

FIG. 5 shows a block diagram of an example of a panel 500 according to one or more embodiments. The panel 500 can include the base 402, the inner foil 404A-B, the outer conductive foil 408A-B, the die 410A-B, or a connective material 518A, 518B, 518C, or 518D situated between the outer conductive foil 408A-B and the inner foil 404A-B. The panel 500 can include an adhesive layer 406A-B situated between the inner foil 404A-B and the outer conductive foil 408A-B (not shown in FIG. 5).

The connective material 518A-D can include solder paste, such as can include tin, silver, copper, lead, indium, a combination thereof, or other solder paste, or a solder thermal interface material, such as can include indium. The connective material 518A-D can be placed on the inner foil 404A-B, the outer conductive foil 408A-B can be placed on the inner foil 404A-B and the connective material 518A-B, and the combination can be heat pressed to melt the connective material 518A-D and form a mechanical connection between the inner foil 404A-B and the outer conductive foil 408A-B, such as to affix the inner foil 404A-B to the outer conductive foil 408A-B, such as at or near edges of the inner foil 404A-B or the outer conductive foil 408A-B.

In an embodiment that includes the adhesive layer 406A-B, the connective material 518A-D can be situated along an edge of the panel 500, such as to protect the interface between the adhesive layer 406A-B and the inner foil 404A-B or the outer conductive foil 408A-B.

The die 410A-B can be removed from the panel 500, such as by removing portions of the panel 500 that include the connective material 518A-D, such as by cutting the panel at the dotted lines 520A-B, and releasing the outer conductive foil 408A-B from the panel 500. The outer conductive foil 408A-B can be removed from the die 410A-B or a substrate which the die 410A-B is a part of, such as by etching away the outer conductive foil 408A-B.

Figure 6:
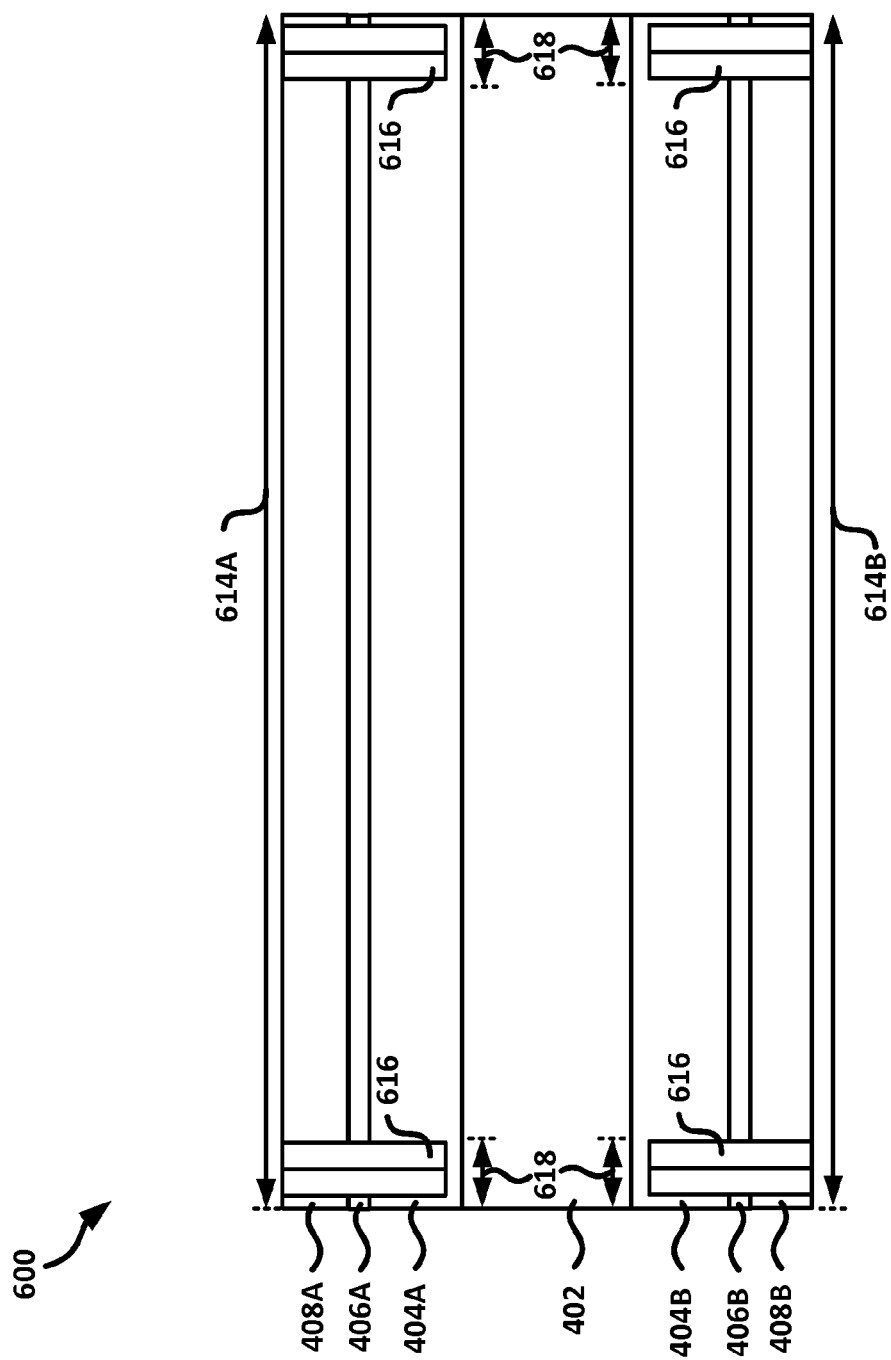
FIG. 6 shows a block diagram of yet another example of a panel according to one or more embodiments.

FIG. 6 shows a block diagram of an example of a panel 600 according to one or more embodiments. The panel 600 can include the base 402, the inner foil 404A-B, an optional adhesive layer 406A-B, or the outer conductive foil 408A-B. The panel 600 can include one or more welds 616 affixing the inner foil 404A-B to the outer conductive foil 408A-B.

The outer conductive foil 408A-B, the inner foil 404A-B or the base 402 can include a width 614A-B, such as to make the outer conductive foil 408A-B, inner foil 404A-B, or the base 402 have substantially the same width 614A-B. A width 618 of the welds 616 can be about one millimeter or less.

Figure 7:
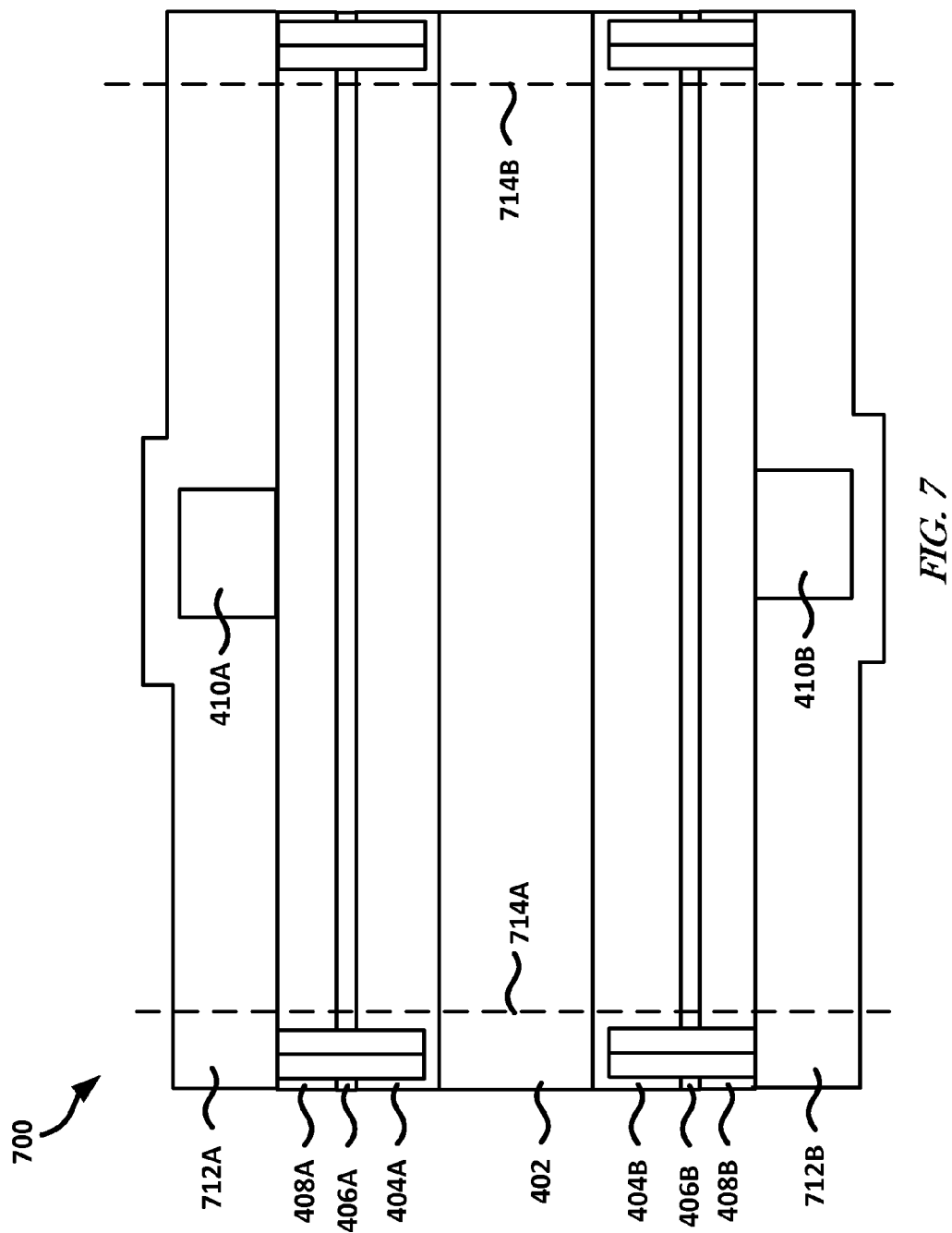
FIG. 7 shows a block diagram of the panel of FIG. 6 with a fully embedded substrate built on the panel according to one or more embodiments.

FIG. 7 shows a block diagram of a panel 700 that includes the panel 600 with the die 410A-B situated on the outer conductive foil 408A-B and a dielectric material 712A or 712B over or around (e.g., encasing) the die 410A-B. Such embodiments can be considered "fully embedded" substrate architectures, because the die 410A-B can be fully embedded in the dielectric (e.g., buildup) layer(s).

Figure 8:
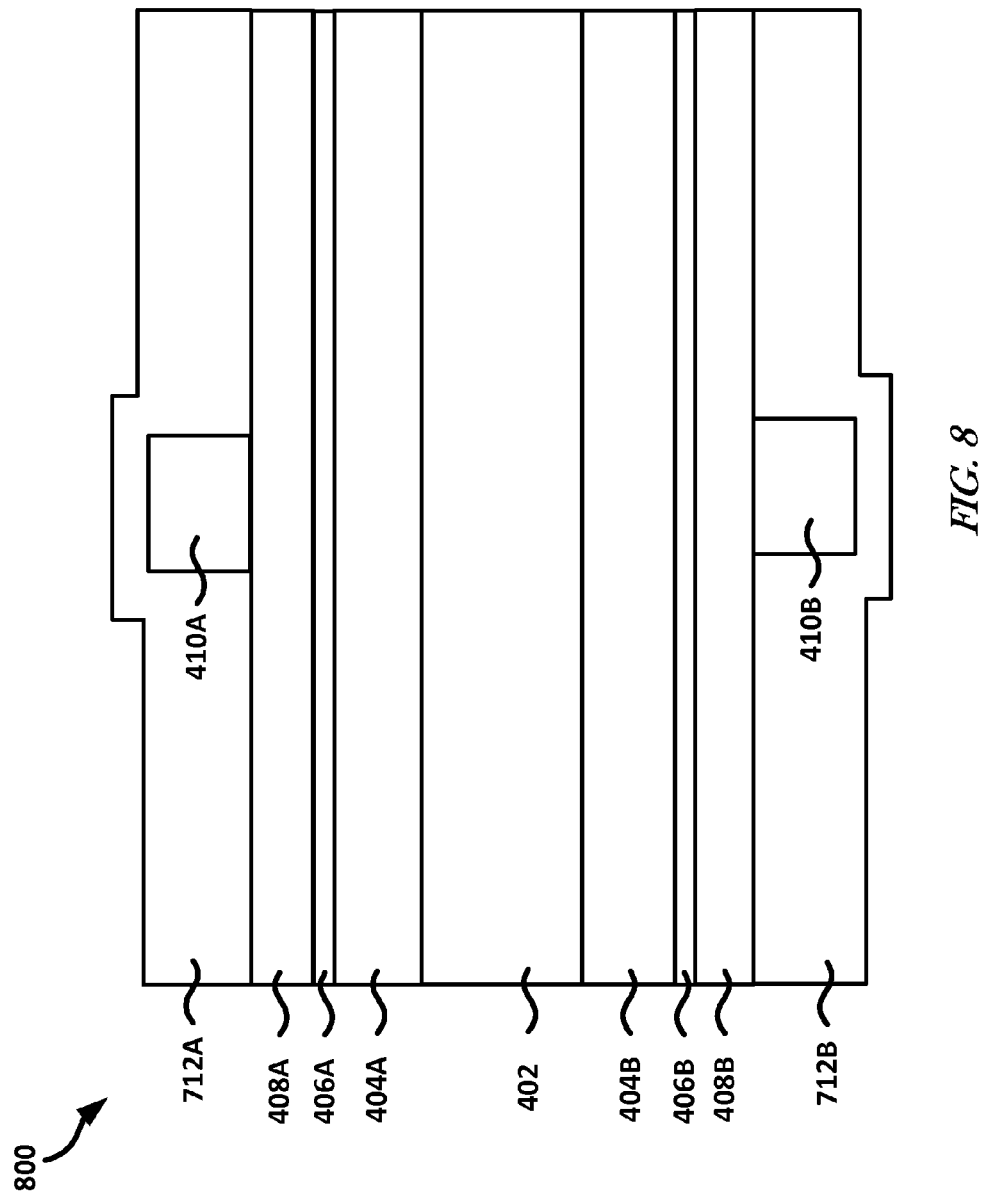
FIG. 8 shows a block diagram of the panel of FIG. 7 with edges of the panel removed.

FIG. 8 shows a block diagram of a panel 800 that includes the panel 700 after the welds 616 have been removed from the panel 700, such as by cutting the panel 700 at the dotted lines 714A-B. The die 410A-B and the dielectric material 712A-B can be removed from the panel 800, such as by releasing the outer conductive foil 408A-B from the inner foil 404A-B. The outer conductive foil 408A-B can be removed from the dielectric material 712A-B (e.g., an etch stop or build up material such as Ajinomoto Buildup Film (ABF)) or the die 410A-B, such as by copper etching the outer conductive foil 408A-B.

Figure 9:
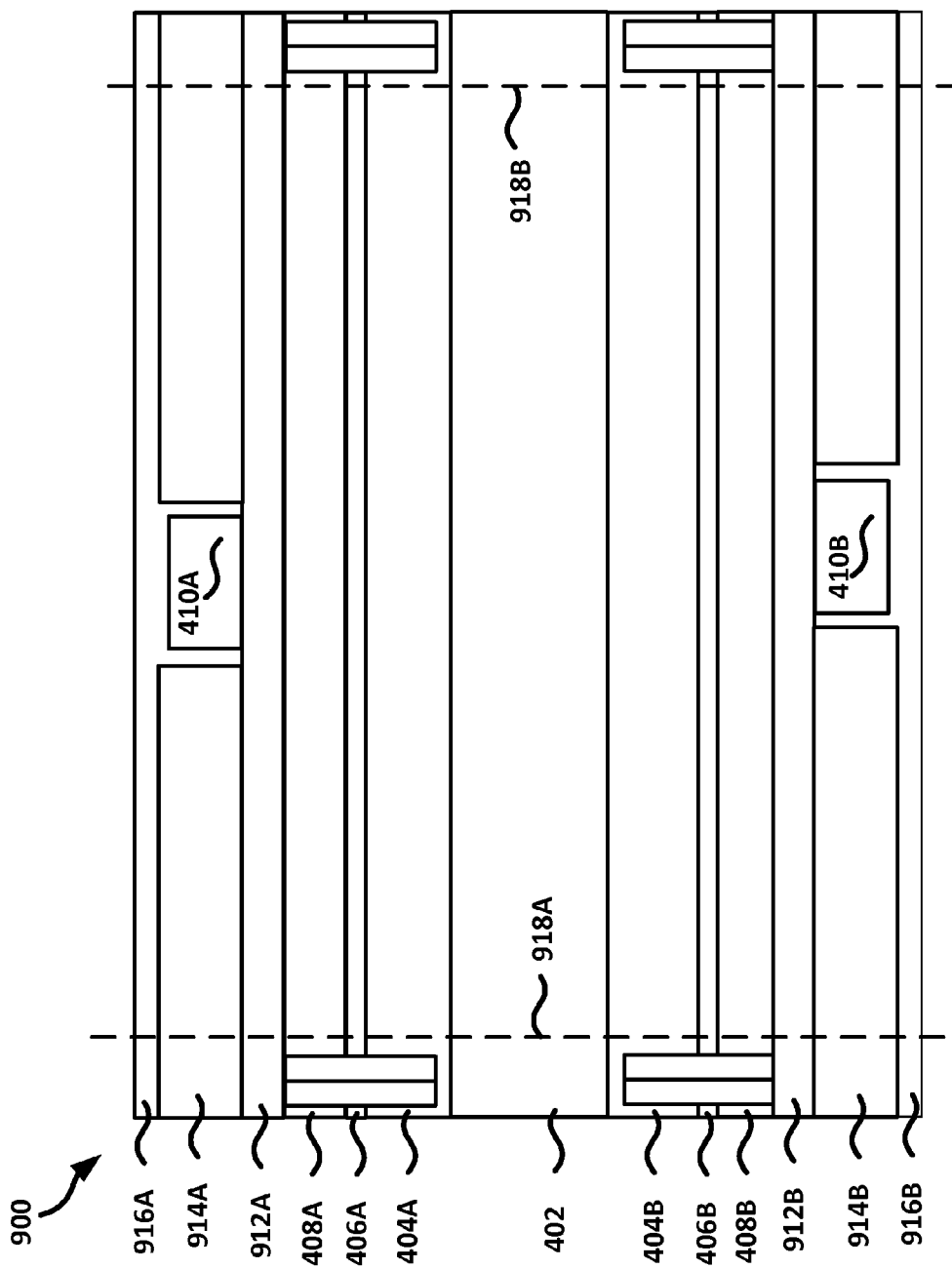
FIG. 9 shows a block diagram of the panel of FIG. 6 with a partially embedded substrate built on the panel according to one or more embodiments.

FIG. 9 shows a block diagram of an example of a panel 900 that includes a partially embedded substrate (e.g., a conductive foil 914A or 914B, the die 410A-B, and the dielectric material 916A-B). The panel 900 can include the base 402, the inner foil 404A-B, the adhesive layer 406A-B, the outer conductive foil 408A-B, a dielectric material 912A or 912B, the conductive foil 914A-B, the die 410A-B, or the dielectric material 916A-B. The dielectric material 912A-B and the conductive foil 914A-B can be jointly considered a resin coated conductive foil. The conductive foil 914A-B can be similar to the inner foil 404A-B or the outer conductive foil 408A-B.

A recess can be formed in the conductive foil 914A-B. The die 410A-B can be situated in the recess. The dielectric material 916A-B can be flowed, dispensed, or applied over the conductive foil 914A-B and the die 410A-B, such as to at least partially encase the die 410A-B in the dielectric material 916A-B.

The dielectric material 916A-B can be similar to the dielectric material 712A-B. The substrate can be considered a partially embedded substrate because the dielectric film only covers a portion of the die, the conductive foil that the die is inserted into can help cover the remainder of the die.

The substrate can be removed from the panel 900 by removing the edges of the panel 900, such as to remove the weld 616, such as by cutting the panel at the dotted lines 918A-B. The outer conductive foil 408A-B can then be released from the panel 900, such as at an interface between the outer conductive foil 408A-B and the adhesive layer 406A-B or the inner foil 404A-B. The outer conductive foil 408A-B can then be removed from the partially embedded substrate, such as by etching the outer conductive foil 408A-B from the substrate. The dielectric material 912A-B can then be removed from the partially embedded substrate, such as by sand blasting, wet blasting, or cutting the dielectric material 912A-B from the substrate.

Note that a fully embedded substrate or a partially embedded substrate can be built on any of the panels 400, 500, or 600. A fully embedded substrate can include a die situated directly on the outer conductive foil and embedded in dielectric material, such as shown in FIG. 7. The partially embedded substrate can include a die situated in a recess of a conductive foil that is situated on a dielectric material that is situated on the outer conductive foil. Dielectric material can be flowed over the die and the conductive foil of the partially embedded substrate. The partially embedded substrate or the fully embedded substrate can be BBUL substrates or cored substrates.

A substrate may be manufactured on the panel without a die situated therein. Such substrates can be a cored die substrate. A coreless die substrate can include a substrate that is built up and a die is attached to the die substrate after the die substrate is built. A cored die substrate can include a substrate that includes a die arranged in the substrate and at least a portion of the substrate is built around the die. A BBUL die substrate can include a substrate that includes a die with one or more buildup layers built above the die to form the die substrate.

While one die is shown in the FIGS., multiple dies can be situated on the panel. The substrate can include a Bumpless Buildup Layer (BBUL) substrate, a Flip Chip substrate, a Surface Mount (SMT) substrate, or other type of substrate.

Note that while embodiments of panels discussed herein are double-sided (i.e. the panels include an inner foil, adhesive layer, and outer conductive foil all situated on opposite sides of the base), the panel can be one-sided. One sided panels are less efficient in terms of throughput, but can include simpler processing at a manufacturing facility.

Processing to make the panel 400, 500, 600, 700, 800, or 900 can be simpler or cheaper than the processing to make the panel 300 or the panel 100. The processing can be simpler in that the inner foil and the outer conductive foil need not be processed to fit in a recess of the base. Also, the base 402 does not need to be processed to include a recess in which the inner foil or the outer conductive foil can be situated in. By removing a processing step, the cost of manufacturing the panel 400, 500, 600, 700, 800, or 900 can be reduced as compared to the cost of manufacturing the panel 100 or 300. Manufacturing the panel 400, 500, 600, 700, 800, or 900 can be simpler than processing to make the panel 300 because the panel 400, 500, 600, 700, 800, or 900 does not require the precise alignment considerations as in the manufacturing of the panel 100 or 300. The active area (e.g., the area on which a substrate can be built) of the panel 400, 500, 600, 700, 800, or 900 can be larger than the active area of the panel 100.

Figure 10:
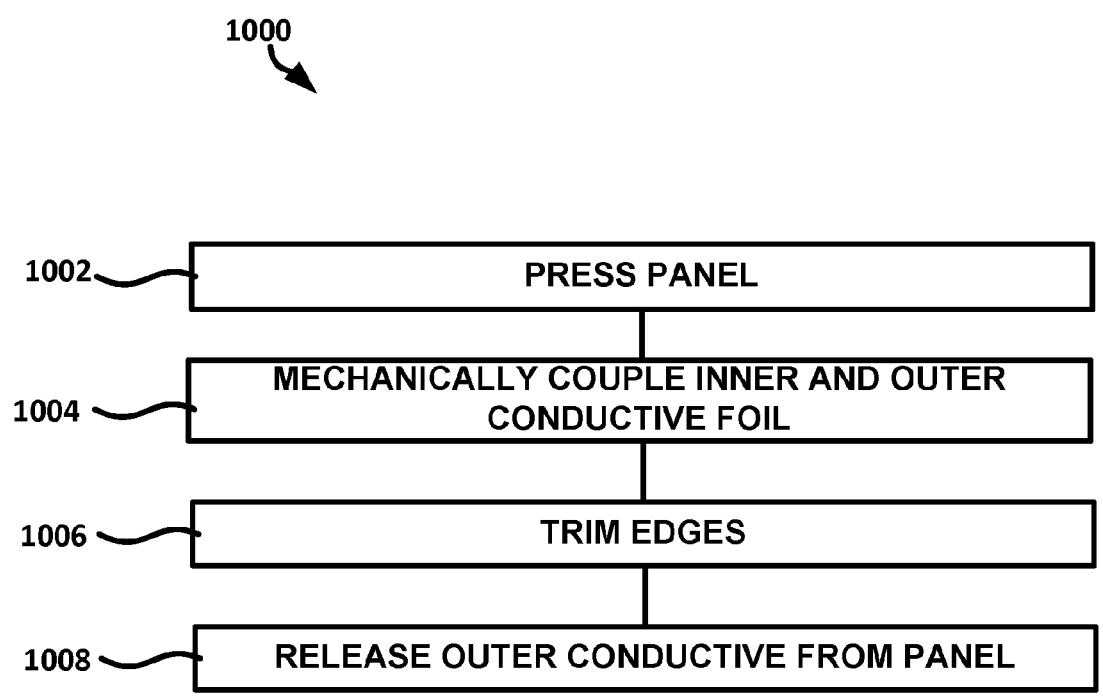
FIG. 10 shows a flow diagram of an example of a technique of making a panel according to one or more embodiments.

FIG. 10 shows a flow diagram of an example of a technique 1000 for making a panel according to one or more embodiments. At 1002, a panel can be pressed. Pressing the panel can include arranging a panel of inner foil on a base, optionally arranging an adhesive layer on the inner foil, optionally arranging connective material on the inner foil, arranging an outer conductive foil on the inner foil, and mechanically pressing the arranges materials, such as under heat, pressure, or in a vacuum.

At 1004, the inner and outer conductive foils can be mechanically coupled to each other. Mechanically coupling the inner and outer conductive foils can include melting a connective material situated between the inner and outer conductive foils, welding (e.g., laser welding) the outer conductive foil to the inner foil, or situating protective material on the edge of the inner and outer conductive foil (e.g., to protect an adhesive layer coupling the inner and outer conductive foils).

At 1006, edges of the panel can be trimmed (e.g., cut or otherwise removed), such as to remove the mechanical coupling between the inner and outer conductive foils (e.g., to remove the weld, at least a portion of the protective material, or the connective material). At 1008, the outer conductive foil can be released from the panel.

Building a panel using the technique 1000 can be more cost effective than building a panel using the technique 200. This can be due to reduced number of steps in the technique 1000 as compared to the technique 200. In the technique 1000 there is no masking film lamination, panel expose or etch, or masking film removal process. Removing a process of the technique can reduce the cost of making a panel using the technique and increase through put by decreasing the amount of time it takes to make a panel using the technique.

Figure 11:
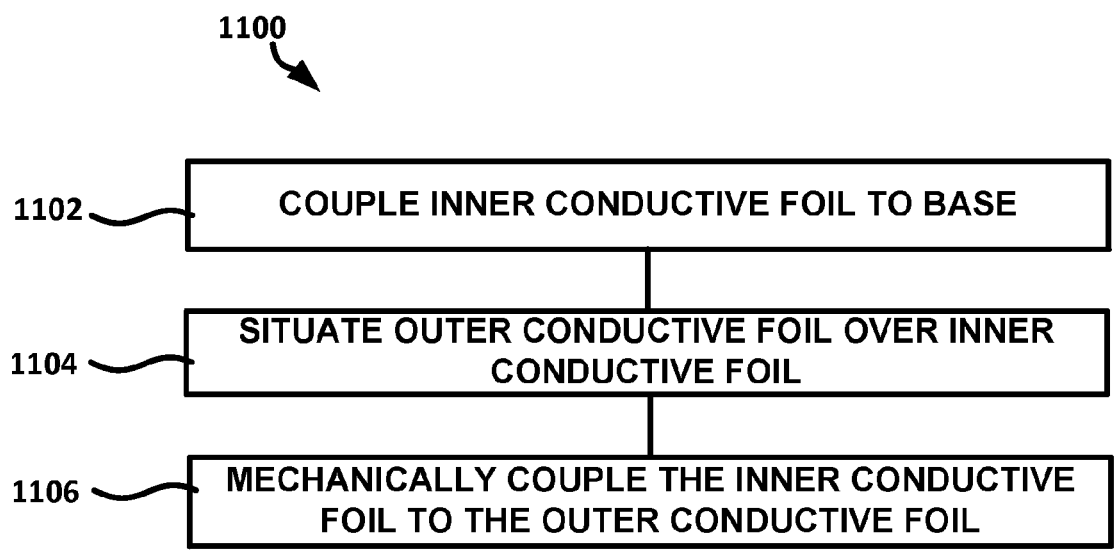
FIG. 11 shows a flow diagram of another example of a technique of making a panel according to one or more embodiments.

FIG. 11 shows a flow diagram of an example of a technique 1100 according to one or more embodiments. At 1102, an inner foil can be coupled (e.g., mechanically coupled or affixed) to a substantially rectangular base. At 1104, an outer conductive foil can be situated on or over the inner foil. At 1106, the inner foil and the outer conductive foil can be coupled together (affixed to each other) near edges of the outer conductive foil and the inner foil, such as by using a connective material. Coupling the inner foil and the outer conductive foil can include welding the inner foil to the outer conductive foil. The connective material can include a solder paste and coupling the inner foil and the outer conductive foil can include reflowing the solder paste between the inner foil and the outer conductive foil.

The technique 1100 can include situating a fully embedded substrate on the outer conductive foil. Situating the fully embedded substrate on the outer conductive foil can include situating a die on the outer conductive foil and situating a dielectric material over and around the die. Situating the fully embedded substrate on the outer conductive foil can include forming a coreless substrate, cored substrate, or a BBUL substrate on the outer conductive foil.

The technique 1100 can include situating a partially embedded substrate on the outer conductive foil. Situating the partially embedded substrate on the outer conductive foil can include: (1) situating a resin coated copper on the outer conductive foil, (2) forming a recess in the resin coated copper, (3) situating a die situated in the recess, or (4) situating a dielectric material over the die and the resin coated copper. Situating the partially embedded substrate on the outer conductive foil can include forming a coreless substrate, cored substrate, or a BBUL substrate on the outer conductive foil.

Figure 12:
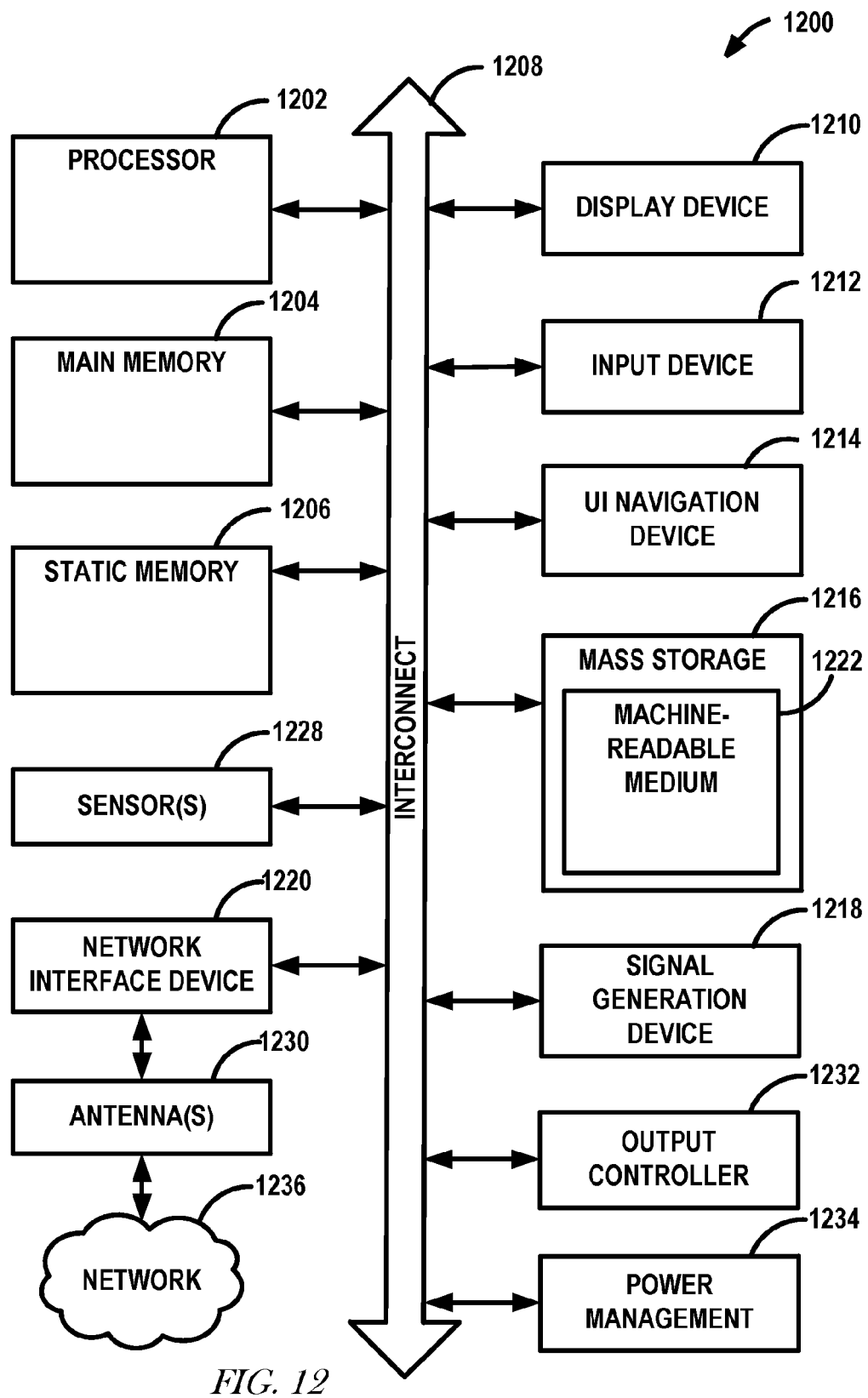
FIG. 12 shows a block diagram of an example of a computer system.

FIG. 12 is a block diagram illustrating an example computer system 1200 machine which can include a substrate that was built on a panel as discussed herein. Computer system 1200 can be a computing device. In an example, the machine can operate as a standalone device or can be connected (e.g., via a cellular network) to other machines. In a networked deployment, the machine can operate in the capacity of either a server or a client machine in server-client network environments, or it can act as a peer machine in peer-to-peer (or distributed) network environments. Further, while only a single machine is illustrated, the term "machine" shall also be taken to include any collection of machines that individually or jointly execute a set (or multiple sets) of instructions to perform any one or more of the methodologies discussed herein.

Example computer system 1200 can include a processor 1202 (e.g., a Central Processing Unit (CPU), a Graphics Processing Unit (GPU) or both), a main memory 1204 and a static memory 1206, which communicate with each other via an interconnect 1208 (e.g., a link, a bus, etc.). The computer system 1200 can further include a video display unit 1210, an alphanumeric input device 1212 (e.g., a keyboard), and a User Interface (UI) navigation device 1214 (e.g., a mouse). In an example, the video display unit 1210, input device 1212 and UI navigation device 1214 are a touch screen display. The computer system 1200 can additionally include a storage device 1216 (e.g., a drive unit), a signal generation device 1218 (e.g., a speaker), an output controller 1232, a power management controller 1234, and a network interface device 1220 (which can include or operably communicate with one or more antennas 1230, transceivers, or other wireless communications hardware), and one or more sensors 1228, such as a GPS sensor, compass, location sensor, accelerometer, or other sensor. The antennas 1230 can be coupled to a network 1226. Any of the items of the system 1200 can include a substrate built on a panel discussed herein.

EXAMPLES AND NOTES

The present subject matter may be described by way of several examples.

Example 1 can include or use subject matter (such as an apparatus, a method, a means for performing acts, or a device readable memory including instructions that, when performed by the device, can cause the device to perform acts), such as can include or use a substantially rectangular base, an inner foil mechanically coupled to the base, an outer conductive foil situated over the inner foil, and connective material coupling the inner foil and the outer conductive foil near edges of the outer conductive foil and the inner foil.

Example 2 can include or use, or can optionally be combined with the subject matter of Example 1, to include or use, wherein the connective material includes a weld.

Example 3 can include or use, or can optionally be combined with the subject matter of Example 1, to include or use, wherein the connective material includes a solder paste.

Example 4 can include or use, or can optionally be combined with the subject matter of at least one of Examples 1-3, to include or use a fully embedded substrate situated on the outer conductive foil.

Example 5 can include or use, or can optionally be combined with the subject matter of Example 4, to include or use, wherein the fully embedded substrate includes a die situated on the outer conductive foil and a dielectric material situated over and around the die.

Example 6 can include or use, or can optionally be combined with the subject matter of at least one of Examples 4-5, to include or use, wherein the fully embedded substrate is a cored substrate or a Bumpless Buildup Layer (BBUL) substrate.

Example 7 can include or use, or can optionally be combined with the subject matter of at least one of Examples 1-3, to include or use a partially embedded substrate situated on the outer conductive foil.

Example 8 can include or use, or can optionally be combined with the subject matter of Example 7 to include or use, wherein the partially embedded substrate includes (1) a resin coated copper situated on the outer conductive foil, (2) a recess formed in the resin coated copper, (3) a die situated in the recess, or (4) a dielectric material situated over the die and the resin coated copper.

Example 9 can include or use, or can optionally be combined with the subject matter of at least one of Examples 7-8 to include or use, wherein the partially embedded substrate is a cored substrate or a Bumpless Buildup Layer (BBUL) substrate.

Example 10 can include or use subject matter (such as an apparatus, a method, a means for performing acts, or a device readable memory including instructions that, when performed by the device, can cause the device to perform acts), such as can include or use coupling an inner foil to a substantially rectangular base, situating an outer conductive foil situated on the inner foil, or coupling, using a connective material, the inner foil and the outer conductive foil near edges of the outer conductive foil and the inner foil.

Example 11 can include or use, or can optionally be combined with the subject matter of Example 10 to include or use, wherein coupling the inner foil and the outer conductive foil includes welding the inner foil to the outer conductive foil.

Example 12 can include or use, or can optionally be combined with the subject matter of Example 10 to include or use, wherein the connective material includes a solder paste and coupling the inner foil and the outer conductive foil includes reflowing the solder paste between the inner foil and the outer conductive foil.

Example 13 can include or use, or can optionally be combined with the subject matter of at least one of Examples 10-12 to include or use, situating a fully embedded substrate on the outer conductive foil.

Example 14 can include or use, or can optionally be combined with the subject matter of Example 13 to include or use, wherein situating the fully embedded substrate on the outer conductive foil includes situating a die on the outer conductive foil and situating a dielectric material over and around the die.

Example 15 can include or use, or can optionally be combined with the subject matter of at least one of Examples 13-14 to include or use, wherein situating the fully embedded substrate on the outer conductive foil includes forming a cored substrate, or a Bumpless Buildup Layer (BBUL) substrate on the outer conductive foil.

Example 16 can include or use, or can optionally be combined with the subject matter of at least one of Examples 10-12 to include or use, situating a partially embedded substrate on the outer conductive foil.

Example 17 can include or use, or can optionally be combined with the subject matter of Example 16 to include or use, wherein situating the partially embedded substrate on the outer conductive foil includes (1) situating a resin coated copper on the outer conductive foil, (2) forming a recess in the resin coated copper, (3) situating a die situated in the recess, or (4) situating a dielectric material over the die and the resin coated copper.

Example 18 can include or use, or can optionally be combined with the subject matter of at least one of Examples 16-17 to include or use, wherein situating the partially embedded substrate on the outer conductive foil includes forming a cored substrate or a Bumpless Buildup Layer (BBUL) substrate on the outer conductive foil.

Example 19 can include or use subject matter (such as an apparatus, a method, a means for performing acts, or a device readable memory including instructions that, when performed by the device, can cause the device to perform acts), such as can include or use (1) a substantially rectangular base, (2) a first inner foil mechanically coupled to a first side of the base, (3) a second inner foil mechanically coupled to a second side of the base, the second side of the base opposite the first side of the base, (4) a first outer conductive foil situated on the first inner foil, (5) a second outer conductive foil situated on the second inner foil, or (6) connective material coupling the first inner foil and the first outer conductive foil near edges of the first outer conductive foil and the first inner foil and coupling the second inner foil and the second outer conductive foil near edges of the second outer conductive foil and the second inner foil.

Example 20 can include or use, or can optionally be combined with the subject matter of Example 19 to include or use, wherein the connective material includes a weld.

Example 21 can include or use, or can optionally be combined with the subject matter of Example 19 to include or use, wherein the connective material includes a solder paste.

Example 22 can include or use, or can optionally be combined with the subject matter of at least one of Examples 19-21 to include or use a first fully embedded substrate situated on the first outer conductive foil and a second fully embedded substrate situated on the second outer conductive foil.

Example 23 can include or use, or can optionally be combined with the subject matter of Example 22 to include or use, wherein the first fully embedded substrate includes a first die situated on the first outer conductive foil and a first dielectric material situated over and around the first die.

Example 24 can include or use, or can optionally be combined with the subject matter of at least one of Examples 22-23 to include or use, wherein the first fully embedded substrate is a cored substrate or a Bumpless Buildup Layer (BBUL) substrate.

Example 25 can include or use, or can optionally be combined with the subject matter of at least one of Examples 19-21 to include or use a first partially embedded substrate situated on the first outer conductive foil and a second partially embedded substrate situated on the second outer conductive foil.

Example 26 can include or use, or can optionally be combined with the subject matter of Example 25 to include or use, wherein the first partially embedded substrate includes (1) a resin coated copper situated on the first outer conductive foil, (2) a recess formed in the resin coated copper, (3) a die situated in the recess, or (4) a dielectric material situated over the die and the resin coated copper.

Example 27 can include or use, or can optionally be combined with the subject matter of at least one of Examples 25-26 to include or use, wherein the first partially embedded substrate is a cored substrate or a Bumpless Buildup Layer (BBUL) substrate.

The above detailed description includes references to the accompanying drawings, which form a part of the detailed description. The drawings show, by way of illustration, specific embodiments in which methods, apparatuses, and systems discussed herein can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

As used herein, a "-" (dash) used when referring to a reference number means "or", in the non-exclusive sense discussed in the previous paragraph, of all elements within the range indicated by the dash. For example, 103A-B means a nonexclusive "or" of the elements in the range {103A, 103B}, such that 103A-103B includes "103A but not 103B", "103B but not 103A", and "103A and 103B".

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A panel comprising:
   a substantially rectangular base including a carbon impregnated with at least one of an epoxy and a resin;
   an inner foil mechanically coupled to the base;
   an outer conductive foil situated over and releasably coupled to the inner foil; and
   connective material coupling the inner foil and the outer conductive foil only near edges of the outer conductive foil and the inner foil.

2. The panel of claim 1, wherein the connective material includes a weld.

3. The panel of claim 1, wherein the connective material includes a solder paste.

4. The panel of claim 1, further comprising a fully embedded substrate situated on the outer conductive foil.

5. The panel of claim 4, wherein the fully embedded substrate includes a die situated on the outer conductive foil and a dielectric material situated over and around the die.

6. The panel of claim 5, wherein the fully embedded substrate includes a cored substrate or a Bumpless Buildup Layer (BBUL) substrate.

7. The panel of claim 1, further comprising a partially embedded substrate situated on the outer conductive foil.

8. The panel of claim 7, wherein the partially embedded substrate includes:
   a resin coated copper situated on the outer conductive foil, a recess formed in resin and copper of the resin coated copper, a die situated in the recess, and a dielectric material situated over the die and the resin coated copper.

9. The panel of claim 8, wherein the partially embedded substrate is a cored substrate or a Bumpless Buildup Layer (BBUL) substrate.

10. A method comprising:
    coupling an inner foil to a substantially rectangular base, the base including a carbon impregnated with at least one of an epoxy and a resin;
    releasably coupling an outer conductive foil on the inner foil; and
    coupling, using a connective material, the inner foil and the outer conductive foil only near edges of the outer conductive foil and the inner foil.

11. The method of claim 10, wherein coupling the inner foil and the outer conductive foil includes welding the inner foil to the outer conductive foil.

12. The method of claim 10, wherein the connective material includes a solder paste and coupling the inner foil and the outer conductive foil includes reflowing the solder paste between the inner foil and the outer conductive foil.

13. The method of claim 10, further comprising situating a fully embedded substrate on the outer conductive foil.

14. The method of claim 13, wherein situating the fully embedded substrate on the outer conductive foil includes situating a die on the outer conductive foil and situating a dielectric material over and around the die.

15. The method of claim 14, wherein situating the fully embedded substrate on the outer conductive foil includes forming a cored substrate, or a Bumpless Buildup Layer (BBUL) substrate on the outer conductive foil.

16. The method of claim 10, further comprising situating a partially embedded substrate on the outer conductive foil.

17. The method of claim 16, wherein situating the partially embedded substrate on the outer conductive foil includes:
    situating a resin coated copper on the outer conductive foil, forming a recess in the resin coated copper, situating a die situated in the recess, and situating a dielectric material over the die and the resin coated copper.

18. The method of claim 17, wherein situating the partially embedded substrate on the outer conductive foil includes forming a cored substrate or a Bumpless Buildup Layer (BBUL) substrate on the outer conductive foil.

19. A panel comprising:
    a substantially rectangular base including a carbon impregnated with at least one of an epoxy and a resin;
    a first inner foil mechanically coupled to a first side of the base;
    a second inner foil mechanically coupled to a second side of the base, the second side of the base opposite the first side of the base;
    a first outer conductive foil situated on and releasably coupled to the first inner foil;
    a second outer conductive foil situated on and releasably coupled to the second inner foil; and
    connective material coupling the first inner foil and the first outer conductive foil only near edges of the first outer conductive foil and the first inner foil and coupling the second inner foil and the second outer conductive foil only near edges of the second outer conductive foil and the second inner foil.

20. The panel of claim 19, wherein the connective material includes a weld.

21. The panel of claim 19, wherein the connective material includes a solder paste.

22. The panel of claim 19, further comprising a first fully embedded substrate situated on the first outer conductive foil and a second fully embedded substrate situated on the second outer conductive foil.

23. The panel of claim 22, wherein the first fully embedded substrate includes a first die situated on the first outer conductive foil and a first dielectric material situated over and around the first die.

24. The panel of claim 19, further comprising a first partially embedded substrate situated on the first outer conductive foil and a second partially embedded substrate situated on the second outer conductive foil.

25. The panel of claim 24, wherein the first partially embedded substrate includes:
    a resin coated copper situated on the first outer conductive foil, a recess formed in the resin coated copper, a die situated in the recess, and a dielectric material situated over the die and the resin coated copper.

* * * * *